United States Patent
Imamura et al.

(10) Patent No.: US 11,020,805 B2
(45) Date of Patent: Jun. 1, 2021

(54) CUTTING TOOL AND METHOD FOR MANUFACTURING THE SAME

(71) Applicant: Sumitomo Electric Hardmetal Corp., Itami (JP)

(72) Inventors: Shinya Imamura, Sorachi-gun (JP); Hideaki Kanaoka, Sorachi-gun (JP); Anongsack Paseuth, Sorachi-gun (JP); Satoshi Ono, Sorachi-gun (JP); Kouhei Yoshimura, Sorachi-gun (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 12 days.

(21) Appl. No.: 16/328,229

(22) PCT Filed: May 25, 2017

(86) PCT No.: PCT/JP2017/019480
§ 371 (c)(1),
(2) Date: Feb. 25, 2019

(87) PCT Pub. No.: WO2018/037647
PCT Pub. Date: Mar. 1, 2018

(65) Prior Publication Data
US 2019/0210117 A1    Jul. 11, 2019

(30) Foreign Application Priority Data

Aug. 25, 2016  (JP) .............................. JP2016-164780

(51) Int. Cl.
*B23B 27/14* (2006.01)
*B23B 27/16* (2006.01)
*B23F 21/00* (2006.01)
*B23G 5/06* (2006.01)
*B23D 77/00* (2006.01)
(Continued)

(52) U.S. Cl.
CPC .......... *B23B 27/1607* (2013.01); *B23B 27/14* (2013.01); *B23B 27/148* (2013.01); *B23B 51/00* (2013.01); *B23C 5/06* (2013.01); *B23C 5/16* (2013.01); *B23D 77/00* (2013.01);
(Continued)

(58) Field of Classification Search
CPC .............................. B23B 27/148; B23B 27/14
USPC .......... 51/307, 309; 428/212, 698, 701, 702; 427/299
See application file for complete search history.

(56) References Cited

U.S. PATENT DOCUMENTS 7,431,747 B2 * 10/2008 Heinrich ................ B23B 27/148
428/701
2007/0184272 A1 * 8/2007 Moriguchi .......... C23C 14/0015
428/411.1
(Continued)

FOREIGN PATENT DOCUMENTS

EP         1840236 A1    10/2007
JP      H04-293749 A    10/1992
(Continued)

*Primary Examiner* — Archene A Turner
(74) *Attorney, Agent, or Firm* — Baker Botts L.L.P.; Michael A. Sartori

(57) ABSTRACT

A cutting tool includes a base material. The base material is a cemented carbide or a cermet. A surface of the base material includes a rake face, a flank face, and a cutting edge face connecting the rake face to the flank face. The base
(Continued)

material has an oxygen concentration of less than or equal to 1 at. % at a depth position of 0.4 μm from the cutting edge face.

7 Claims, 6 Drawing Sheets

(51) Int. Cl.
    *B24B 3/34*     (2006.01)
    *B23B 51/00*     (2006.01)
    *B23C 5/16*     (2006.01)
    *B23C 5/06*     (2006.01)

(52) U.S. Cl.
    CPC .............. *B23F 21/00* (2013.01); *B23G 5/06* (2013.01); *B24B 3/34* (2013.01)

(56) References Cited

U.S. PATENT DOCUMENTS

| | | | |
|---|---|---|---|
| 2007/0227298 A1* | 10/2007 | Tanibuchi | C22C 29/08 75/241 |
| 2009/0044415 A1 | 2/2009 | Fujino et al. | |
| 2009/0067938 A1* | 3/2009 | Omori | C23C 30/005 407/119 |
| 2012/0128955 A1* | 5/2012 | Leicht | C23C 16/56 428/698 |
| 2012/0282049 A1* | 11/2012 | Okada | C23C 16/0272 407/115 |
| 2017/0259345 A1 | 9/2017 | Detani et al. | |

FOREIGN PATENT DOCUMENTS

| | | |
|---|---|---|
| JP | H05-98384 A | 4/1993 |
| JP | H05-237707 A | 9/1993 |
| JP | H07-223102 A | 8/1995 |
| JP | 08-092685 * | 4/1996 |
| JP | H08-92685 A | 4/1996 |
| JP | 2007-260824 | 10/2007 |
| JP | 2008-069420 | 3/2008 |
| JP | 2009-006439 A | 1/2009 |
| JP | 2012-030309 A | 2/2012 |
| JP | 2012-157915 A | 8/2012 |
| JP | 3177984 U | 8/2012 |
| JP | 2013-107187 A | 6/2013 |
| JP | 2013-244549 A | 12/2013 |
| JP | 2015-009327 A | 1/2015 |
| JP | 2015-508716 A | 3/2015 |
| JP | 5904389 B1 | 4/2016 |
| WO | 2013/127786 A1 | 9/2013 |

* cited by examiner

CUTTING TOOL AND METHOD FOR MANUFACTURING THE SAME

TECHNICAL FIELD

The present invention relates to a cutting tool and a method for manufacturing the cutting tool. The present application claims priority to Japanese Patent Application No. 2016-164780 filed on Aug. 25, 2016, the disclosure of which is hereby incorporated by reference in its entirety.

BACKGROUND ART

With the aim of extending the life of the cutting tool, various studies have been conducted. For example, Japanese Patent Laying-Open Nos. 5-237707 (PTL 1) and 2013-244549 (PTL 2) each disclose a cutting tool including a base material and a coating formed on a surface of the base material. Respective disclosures of these documents both aim to improve the wear resistance of the cutting tool by providing a hard coating on the surface of the base material.

CITATION LIST

Patent Literature

PTL 1: Japanese Patent Laying-Open No. 5-237707
PTL 2: Japanese Patent Laying-Open No. 2013-244549

SUMMARY OF INVENTION

A cutting tool according to an aspect of the present disclosure is a cutting tool including a base material. The base material is a cemented carbide or a cermet. A surface of the base material includes a rake face, a flank face, and a cutting edge face connecting the rake face to the flank face. The base material has an oxygen concentration of less than or equal to 1 at. % at a depth position of 0.4 μm from the cutting edge face.

A method for manufacturing a cutting tool according to an aspect of the present disclosure is a method for manufacturing the above-described cutting tool. The method includes: preparing a base material precursor; and producing a base material by machining a surface of the base material precursor. The machining is one of: a first grinding process of alternately repeating wet grinding and dry grinding; a second grinding process of performing low-feed low-depth-of-cut wet grinding; or a third grinding process of performing dry grinding.

DETAILED DESCRIPTION

Figure 1:
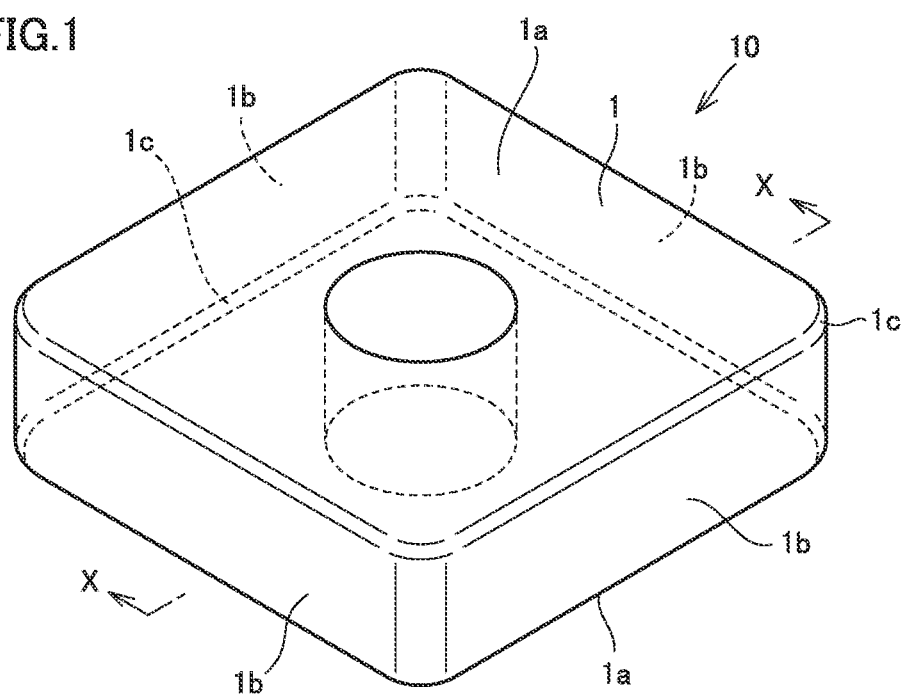
FIG. 1 is a perspective view illustrating an example of a cutting tool.

Problem to be Solved by the Present Disclosure

For the cutting tool having the coating as described above, it is necessary to address the problem that the coating may peel off (i.e. tool fracture) due to lack of adhesion between the coating and the base material. For example, according to PTL 1, WC and Co which are components of the base material can be prevented from being diffused into the coating so as to produce a stable adhesion. According to PTL 2, the defect density in the surface of the base material can be controlled to produce a stable adhesion.

A variety of different demands are imposed on the cutting tool. For example, there may be a demand for a cutting tool without coating (also referred to as "non-coated cutting tool") for the sake of lower cost and the like. Moreover, the severity of demands on a cutting tool with a coating (also referred to as "coated cutting tool") is increasing. Under the circumstances, every type of cutting tools is generally required to have a longer life.

In view of the above, an object of the present disclosure is to provide a cutting tool having an extended life as well as a method for manufacturing the cutting tool.

Advantageous Effect of the Present Disclosure

According to the foregoing, a cutting tool having an extended life and a method for manufacturing the cutting tool are provided.

DESCRIPTION OF EMBODIMENTS

First of all, the present invention is described based on features listed below. The expression "A to B" as used herein is intended to define an upper limit and a lower limit of a certain range (i.e., from A to B inclusive). As to "A to B" where A is not followed by a unit symbol and only B is followed by a unit symbol, the unit of A is the same as the unit of B.

[1] A cutting tool according to an aspect of the present disclosure is a cutting tool including a base material. The base material is a cemented carbide or a cermet. A surface of the base material includes a rake face, a flank face, and a cutting edge face connecting the rake face to the flank face. The base material has an oxygen concentration of less than or equal to 1 at. % at a depth position of 0.4 μm from the cutting edge face. Such a cutting tool is excellent in wear resistance and fracture resistance and can therefore have a long life.

[2] The base material of the cutting tool has an oxygen concentration of less than or equal to 10 at. % at a depth position of 0.2 μm from the cutting edge face. Accordingly, the cutting tool can have a still longer life.

[3] The cutting edge face of the base material of the cutting tool has a strain of less than or equal to 0.07. Accordingly, the cutting tool can have a still longer life.

[4] The cutting tool further includes a coating formed on the base material. Accordingly, the cutting tool has enhanced characteristics of the cutting tool.

[5] The coating of the cutting tool includes a compound layer made from: at least one kind of first element selected from the group consisting of Group IV elements, Group V elements, and Group VI elements in the periodic table, Al, and Si; and at least one kind of second element selected from the group consisting of B, C, N, and O. Such a coating can improve the characteristics of the cutting tool.

[6] A method for manufacturing a cutting tool according to an aspect of the present disclosure is a method for manufacturing the above-described cutting tool. The method includes: preparing a base material precursor; and producing a base material by machining a surface of the base material precursor. The machining is one of: a first grinding process of alternately repeating wet grinding and dry grinding; a second grinding process of performing low-feed low-depth-of-cut wet grinding; or a third grinding process of performing dry grinding. Accordingly, the cutting tool having a long life can be manufactured.

[7] The method for manufacturing further includes forming a coating on a surface of the base material. Accordingly, the cutting tool having the coating can be manufactured.

DETAILS OF EMBODIMENTS OF THE INVENTION

The inventors of the present invention first conducted a wear resistance test on a variety of coated cutting tools, and observed cross sections of the tested coated cutting tools with a scanning electron microscope (SEM). As a result of the observation, not only peeling of the coating but also depth-direction extension of cracks from the cutting edge face of the base material and dropping off of hard particles originally contained in the base material were confirmed. In order to find the cause of these phenomena, the inventors performed atomic-level observation rather than the conventional nano-level observation.

Specifically, they used x-ray photoelectron spectroscopy (XPS) to observe coated cutting tools before and after the wear resistance test, checked the results of the observation against the results of the wear resistance test, and further conducted studies. They found that unintended oxygen atoms had entered the base material of the coated cutting tool and the presence of the oxygen atoms was involved in the above phenomena.

The coated cutting tool is produced through a process in a relatively severe environment. Specifically, the coating is formed on the surface of the base material by chemical vapor deposition or the like. It was therefore originally assumed that the step of forming a coating on the base material supplied oxygen atoms into the base material. However, studies of the non-coated cutting tool revealed that oxygen atoms also entered the base material of the non-coated cutting tool. The above assumption was thus disproved.

The inventors then focused on machining performed on a base material precursor. "Base material precursor" is a material machined into "base material" by beveling of the surface of the base material precursor to form a cutting edge. In other words, this machining is a process performed on a base material precursor such as a sintered material, so that the base material precursor assumes properties of the base material for the cutting tool. For machining a hard base material precursor, high-feed high-depth-of-cut wet grinding is performed industrially in order to suppress heat generation during the machining or to improve the machining quality. The inventors found that water used for this wet grinding was a source of the oxygen atoms.

Subsequently, the inventors conducted further studies on the difference in the manner in which oxygen atoms enter the base material, depending on the difference in the machining method. The inventors employed a machining method different from conventional methods to succeed in improving the wear resistance of both the coated cutting tool and the non-coated cutting tool. The present invention has been made in this way.

An embodiment (hereinafter referred to as "present embodiment") of the present invention is described in the following. The present embodiment, however, is not limited to those described herein. In the drawings used for the following description of the embodiment, the same reference characters denote the same parts or corresponding parts. A compound or the like expressed herein by a chemical formula includes the compound with any of all conventionally known atomic ratios if the atomic ratio is not particularly limited, and the compound is not necessarily limited to the compound with a stoichiometric ratio. For example, regarding an expression "TiCN," the ratio of the number of atoms between the elements constituting TiCN is not limited to Ti:C:N=1:0.5:0.5, but includes all conventionally known atomic ratios.

<Cutting Tool>

A cutting tool of the present embodiment includes a base material. The shape and the use for example of the cutting tool are not particularly limited. The cutting tool of the present embodiment may for example be drill, end mill, indexable insert for the drill, indexable insert for the end mill, indexable insert for milling, indexable insert for turning, metal-slitting saw, gear-cutting tool, reamer, tap, or the like.

<<Base Material>>

The base material is a cemented carbide or a cermet. The cemented carbide may be a WC-based cemented carbide (also including a cemented carbide containing WC and Co, or alternatively a cemented carbide containing WC and Co and additionally a carbonitride of Ti, Ta, Nb or the like). The cermet may be a cermet containing TiC, TiN, TiCN or the like as a main component. In particular, the cermet is preferably a TiCN-based cermet.

The base material has a surface. The surface includes a rake face, a flank face, and a cutting edge face connecting the rake face to the flank face. The cutting edge face is a surface forming a cutting edge of the cutting tool. Which region of the base material is to form a cutting edge face is determined depending on the shape of the base material, as described below with reference to FIGS. 1 to 3.

Figure 2:
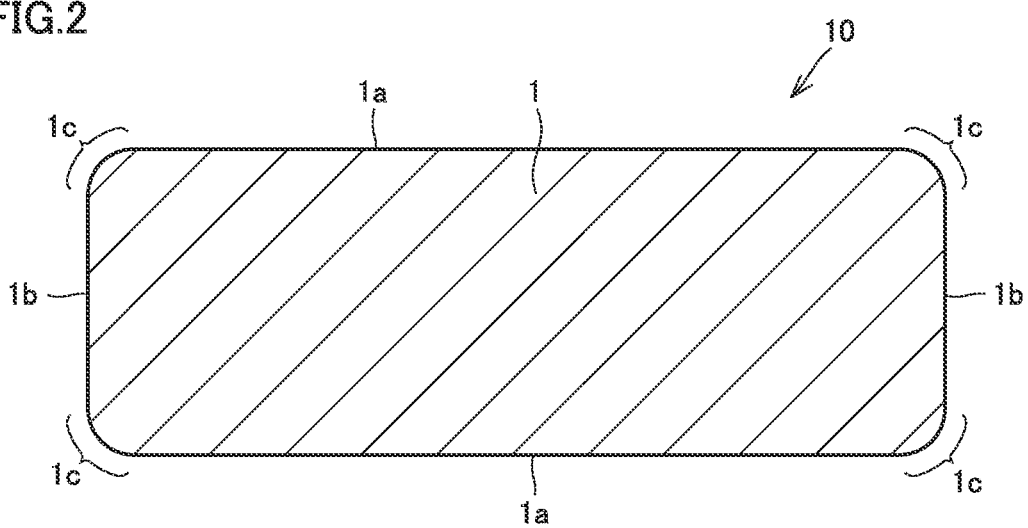
FIG. 2 is a cross-sectional view along line X-X as seen in the direction indicated by arrows in FIG. 1.

FIG. 1 is a perspective view illustrating an example of the cutting tool, and FIG. 2 is a cross-sectional view along line X-X as seen in the direction indicated by the arrows in FIG. 1. The cutting tool having such a shape is used as an indexable insert for turning.

Cutting tool 10 shown in FIGS. 1 and 2 has a surface including an upper surface, a lower surface, and four side surfaces. The overall shape of cutting tool 10 is a quadrangular prism of which top-to-bottom thickness is somewhat thin. In cutting tool 10, a through hole extending through the upper and lower surfaces is formed. Along each of the boundaries of the four side surfaces, an arcuate surface connects a side surface to its adjacent side surface.

As to cutting tool 10, the upper surface and the lower surface each form a rake face 1a, the four side surfaces (and the arcuate surfaces connecting them) each form a flank face 1b, and the arcuate surface connecting rake face 1a to flank face 1b forms a cutting edge face 1c.

Figure 3:
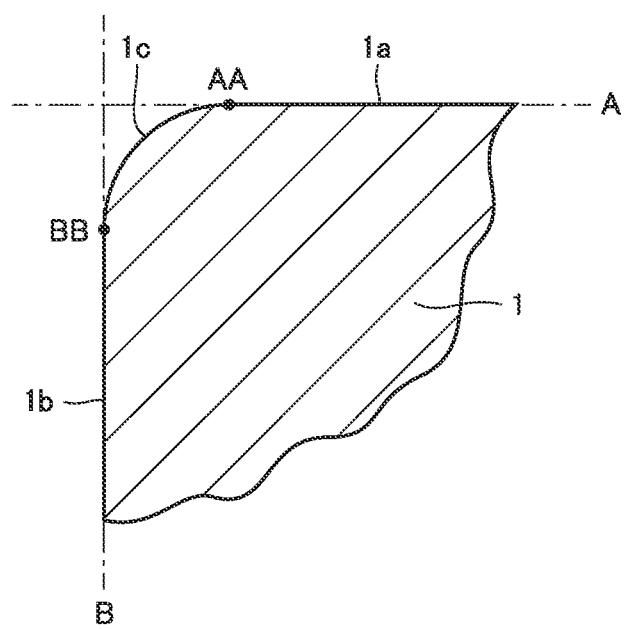
FIG. 3 is partially enlarged view of FIG. 2.

FIG. 3 is a partially enlarged view of FIG. 2. FIG. 3 shows an imaginary plane A including rake face 1a, an imaginary boundary line AA at which rake face 1a and imaginary plane A part from each other, an imaginary plane B including flank face 1b, and an imaginary boundary line BB at which flank face 1b and imaginary plane B part from each other. In FIG. 3, each imaginary plane A, B is shown as a line and each imaginary boundary line AA, BB is shown as a dot. In FIG. 3, the surface inside the region between imaginary boundary line AA and imaginary boundary line BB is cutting edge face 1c.

Thus, cutting edge face 1c is generally a surface of base material 1. The ridgeline at which surfaces of base material 1 meet is machined to form cutting edge face 1c. In other words, base material 1 is formed by machining at least a part of the surface of a base material precursor formed of a sintered material or the like, and cutting edge face 1c is formed through beveling by means of machining.

Figure 4:
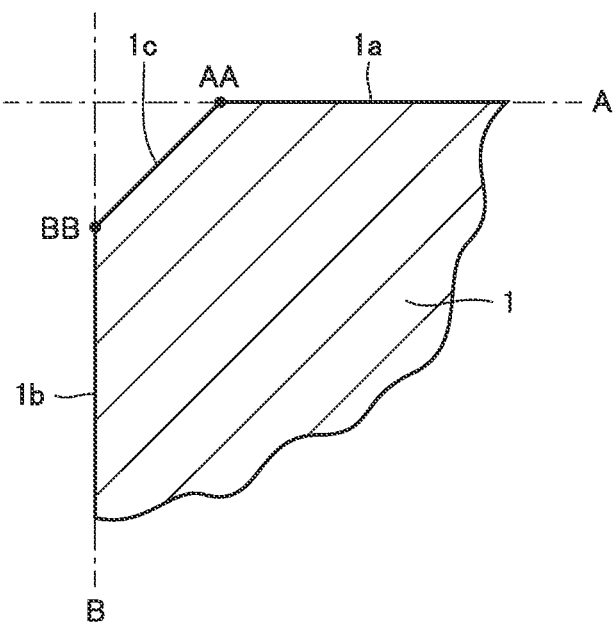
FIG. 4 illustrates a different shape of a cutting edge face.

While FIGS. 1 to 3 show cutting edge face 1c which is an arcuate surface, the shape of cutting edge face 1c is not limited to this. For example, as shown in FIG. 4, cutting edge face 1c may have a flat shape. Further, as shown in FIG. 5, cutting edge face 1c may have a shape which is a combination of a flat surface and an arcuate surface.

Figure 5:
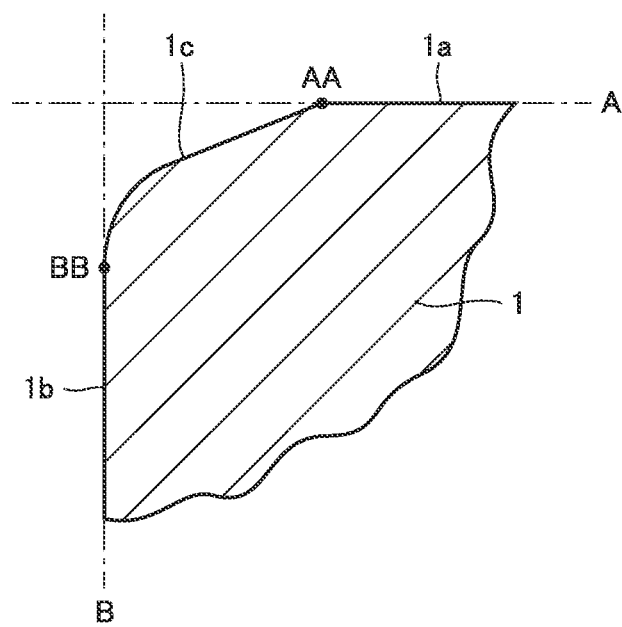
FIG. 5 illustrates another different shape of the cutting edge face.

Regarding base materials 1 having respective shapes as shown in FIGS. 3 to 5 as described above, cutting edge face 1c can be determined easily from its shape only. This is for the reason: cutting edge face 1c in this case is included in none of imaginary plane A and imaginary plane B and can therefore be distinguished easily from rake face 1a and flank face 1b by visual inspection.

Figure 6:
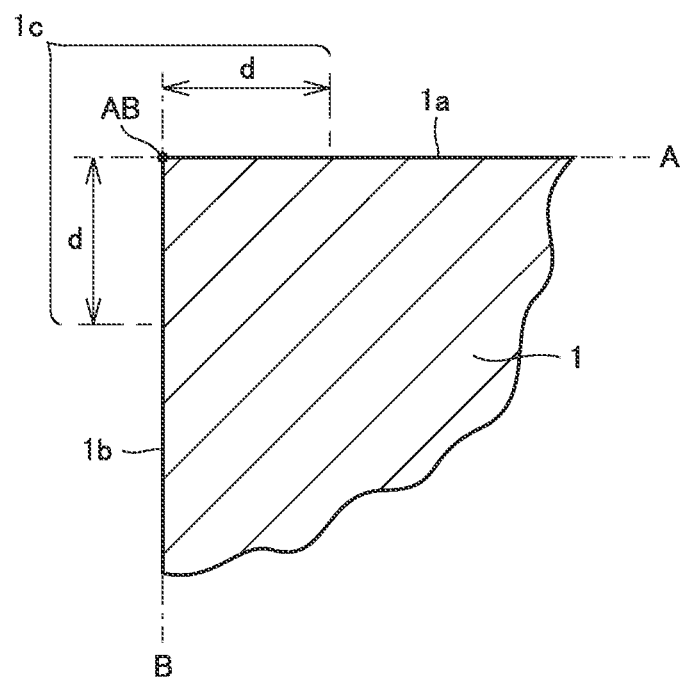
FIG. 6 illustrates still another different shape of the cutting edge face.

Regarding base material 1 having a sharp edge shape as shown in FIG. 6, it is difficult to determine cutting edge face 1c formed by machining, from its shape only. This is for the reason: cutting edge face 1c in this case is included in imaginary plane A and/or imaginary plane B and it is therefore difficult to distinguish cutting edge face 1c from rake face 1a and flank face 1b by visual inspection.

In view of the above, regarding base material 1 having a sharp edge shape, cutting edge face 1c is defined herein as a surface included in a region within a distance d of 100 μm from a ridgeline AB at which rake face 1a and flank face 1b meet each other, since base material 1 included in this region is capable of functioning as a cutting edge of cutting tool 10.

Oxygen Concentration

The base material of the present embodiment has an oxygen concentration of less than or equal to 1 at. % at a depth position of 0.4 μm from the cutting edge face. The oxygen concentration can be measured with an XPS analyzer applicable to XPS.

XPS can be used to measure the ratio of atoms of a given kind at a given depth position in a target of measurement while etching the surface of the target by means of ions of Ar for example. Thus, XPS can be used to determine the oxygen concentration at a depth position of 0.4 μm from the cutting edge face which is a surface of the base material. The etching area at this time may be 500 to 50000 μm². The oxygen concentration is measured under vacuum.

Regarding the cutting edge face having a sharp edge shape, the cutting edge face includes a cutting edge face on the rake face side and a cutting edge face on the flank face side. In this case, "a depth position of 0.4 μm from the cutting edge face which is a surface of the base material" means a position at a depth of 0.4 μm from one of the cutting edge faces and at a depth of more than or equal to 0.4 μm from the other cutting edge face.

For a cutting tool in which the surface of the base material does not form the topmost surface of the cutting tool, such as a cutting tool having another member such as coating on the surface of the base material, for example, the surface of the base material is identified in the following way. First, in accordance with XPS, the cutting tool is etched from its topmost surface corresponding to the cutting edge face of the base material. Then, the depth position at which an element specific to the raw material for the base material (e.g. an element forming a binder phase in the base material) is measured is identified as a cutting edge face of the base material.

The aforementioned oxygen concentration may be an average value. Specifically, given three measurement sites are determined on the cutting edge face of the base material, and the oxygen concentration is measured at a depth position of 0.4 μm from each of the measurement sites. The average of respective oxygen concentrations measured at these sites may be determined as the oxygen concentration.

The inventors measured the oxygen concentration at a plurality of measurement sites of the cutting edge face to find that there is no significant difference between the value taken at each measurement site and the average value. Therefore, the oxygen concentration may be measured at a given single site of the cutting edge face and the value taken at this site may be determined as the oxygen concentration. If the measured oxygen concentration has an apparently abnormal value, however, such a value should be excluded. The single site is preferably determined in a central portion of the cutting edge face, since this portion contributes significantly to characteristics of the cutting tool and is therefore appropriate as a site for evaluating the characteristics of the cutting tool.

Regarding the cutting tool of the present embodiment, the base material having an oxygen concentration of less than or equal to 1 at. % at a depth position of 0.4 μm from the cutting edge face can impart a high wear resistance and accordingly a long life to the cutting tool.

The inventors have found the following (a) to (c) by studies regarding the present disclosure:

(a) in the cutting edge face of the base material for the cutting tool, unintended oxygen atoms have entered, and the oxygen concentration derived from the oxygen atoms is highest in the vicinity of the cutting edge face and decreases gradually toward the inside of the base material;

(b) the higher the oxygen concentration in the vicinity of the cutting edge face, the deeper the locations of oxygen in the base material;

(c) in the base material in which oxygen atoms enter at a deep depth from the cutting edge face, cracks are likely to extend inward from the cutting edge face, and hard particles forming the base material are likely to drop off.

Based on the above findings, the inventors suppose the reasons why the cutting tool of the present embodiment has a long time. Specifically, in the base material of the conventional cutting tool, unintended oxygen atoms are present in a region from the cutting edge face inward to a certain depth position. In a region in which the oxygen atoms are present at a high concentration that may influence the physical properties of the base material (also referred to as "high oxygen region"), the base material embrittles. Thus, cracks generated in the cutting edge face are likely to extend in the high oxygen region extending from the cutting edge face inward (in the depth direction of the base material).

Particularly in the conventional cutting tool, the width of the high oxygen region (the depth extending straight inward of the base material from the cutting edge face) is relatively large. As a result, a large (long) crack is formed. Hard particles included in the high oxygen region and hard particles mostly located in the high oxygen region are likely to drop off.

In contrast, in the cutting tool of the present embodiment, the base material has an oxygen concentration of less than or equal to 1 at. % at a depth position of 0.4 μm from the cutting edge face, and the width of the high oxygen region is smaller than that of the conventional cutting tool or the base material does not have a high oxygen region. Therefore, 1) the region in which brittlement may occur is smaller than the conventional cutting tool or there is no such a region, which provides higher hardness than the conventional cutting tool, and 2) even when an origin of a crack is generated, extension of the crack is reduced as compared with the conventional cutting tool.

In particular, when the oxygen concentration at a depth position of 0.4 µm is less than or equal to 1 at. %, the width of the high oxygen region is likely to be smaller than the particle size of hard particles located in the surface of the base material. Therefore, even when cracks extend across the entire high oxygen region, the length of the cracks is likely to be smaller than the particle size of hard particles located in the topmost surface of the base material, and eventually drop-off of hard particles is suppressed. The cutting tool of the present embodiment can therefore have a high wear resistance and a high fracture resistance and hence a long life.

Regarding the cutting tool of the present embodiment, the base material preferably has an oxygen concentration of less than or equal to 10 at. % at a depth position of 0.2 µm from the cutting edge face. In this case, extension of cracks can further be suppressed and drop-off of hard particles can further be suppressed, and therefore, a still longer life of the cutting tool is possible. Theoretically the oxygen concentration at a depth position of 0.4 µm from the cutting edge face and the oxygen concentration at a depth position of 0.2 µm from the cutting edge face are preferably 0 at. %

Strain

Regarding the cutting tool of the present embodiment, the base material preferably has a strain of less than or equal to 0.07 in the cutting edge face. The strain in the cutting edge face can be determined by applying x-ray diffractometry. High-brightness x-ray like radioactive ray is preferable in that high-precision measurement is possible. As is apparent, however, a common x-ray apparatus may be used.

Regarding a diffraction profile of x-ray diffraction angle ($2\theta$) and diffraction intensity obtained by x-ray diffractometry, it is known that the diffraction peak expands (broadens) depending on each of crystallite size and strain. Each of the diffraction peak depending on crystallite size and the diffraction peak depending on strain can be approximated by a Lorentz function to express the integral breadth $\beta$ of the diffraction peak by the following expression (1), where $\beta$size is the integral breadth of the diffraction profile depending on crystallite size, and $\beta$strain is the integral breadth of the diffraction profile depending on strain.

$$\beta = \beta size + \beta strain \quad (1)$$

$\beta$size and $\beta$strain are expressed by the following expression (2) and expression (3) where $\lambda$ is wavelength of x-ray, $\varepsilon$ is crystallite size, $\theta$ is incident angle of x-ray, $\eta$ is strain (non-uniform lattice strain), and $\theta_0$ is Bragg angle. Further, the following expressions (2) and (3) are substituted into the above expression (1) to obtain the following expression (4).

$$\beta size = \lambda/(\varepsilon \cos \zeta_0) \quad (2)$$

$$\beta strain = \eta \tan \theta_0 \quad (3)$$

$$\beta \cos \theta_0/\lambda = 1/\varepsilon + \eta \sin \theta_0/\lambda \quad (4)$$

On a two-axis graph with the vertical axis representing $\beta \cos \theta_0/\lambda$ and the horizontal axis representing $\sin \theta_0/\lambda$, values determined from multiple diffraction profiles with different $2\theta$ values are plotted, and the plots are linearly regressed. The slope of the obtained regression line is strain (non-uniform lattice strain) and the reciprocal of the segment of the regression line is crystallite size.

The above-described strain may be an average value. Specifically, respective diffraction profiles (multiple diffraction profiles that are different in incident angle) are obtained at given three measurement sites in the cutting edge face of the base material, and the $\eta$ value at each measurement site is calculated. The average of respective $\eta$ values is determined as the strain. The measurement sites are located in a region of the base material at a thickness in the depth direction of 1.5 µm from the cutting edge face of the base material. Specifically, the strain is measured at each measurement site as an integral value of the strain of the base material in the region from the cutting edge face to the 1.5 µm depth.

The inventors also calculated respective $\eta$ values at multiple measurement sites of the cutting edge face to confirm that there is no significant difference between each value and the average value. Therefore, the strain may be measured at a given single site of the cutting edge face and the value taken at this site may be determined as the strain. If the measured strain has an apparently abnormal value, however, such a value should be excluded. The single site is preferably determined in a central portion of the cutting edge face, since this portion contributes significantly to characteristics of the cutting tool and is therefore appropriate as a site for evaluating the characteristics of the cutting tool.

A sufficiently small strain of "less than or equal to 0.07" enables a still longer life of the cutting tool. This is for the reason that the small strain at such a site improves the peeling resistance of a coating formed on the base material as described below. The strain is more preferably less than or equal to 0.05. In this case, a still further longer life of the cutting tool is possible. Theoretically, it is most preferable that the strain is 0.

<<Coating>>

The cutting tool of the present embodiment may further include a coating formed on the base material. Such a coating acts to improve various characteristics of the cutting tool such as wear resistance and toughness, by covering the surface of the base material. The cutting tool of the present embodiment is particularly excellent in adhesiveness between the base material and the coating, and can therefore suppress shortening of the tool life due to peeling of the coating. Therefore, the cutting tool of the present embodiment further including the coating can improve not only the wear resistance of the cutting tool itself but also the adhesiveness between the base material and the coating so as to enable a significantly longer life of the cutting tool.

The reasons for the high adhesiveness between the base material and the coating in the cutting tool of the present embodiment are supposed to be as follows. If the oxygen concentration in the base material is high, the hardness of the base material may be low and/or the structure of the base material may be non-uniform. With such deterioration of the base material, the adhesiveness between the base material and the coating tends to be decreased. In contrast, in the cutting tool of the present embodiment, the width of the high oxygen region is relatively small as described above, and therefore, the oxygen concentration in the vicinity of the cutting edge face is lower than the conventional cutting tool. The foregoing is seen from the findings (a) to (c) described above. Thus, in the cutting tool of the present embodiment, deterioration of the base material is suppressed and consequently the adhesiveness between the base material and the coating is improved.

The coating may be a physical vapor deposition layer formed by the physical vapor deposition (PVD) method, or a chemical vapor deposition layer formed by the chemical vapor deposition (CVD) method. The physical vapor deposition layer is usually formed on a base material having undergone etching by ions. In contrast, the chemical vapor deposition layer is usually formed on a base material having undergone no etching. If the aforementioned coating is a chemical vapor deposition layer formed by the chemical vapor deposition method, the advantageous effects of the present embodiment are further enhanced. The physical vapor deposition layer and the chemical vapor deposition layer are clearly distinguished from each other through SEM observation of respective surfaces of these layers.

The coating has a thickness of preferably 0.3 to 15 μm. The coating having a thickness of more than or equal to 0.3 μm can sufficiently exhibit the characteristics of the coating. The coating can have a thickness of less than or equal to 15 μm to suppress peel-off of the coating due to an excessively large coating thickness.

The thickness of the coating is determined in the following way. First, a sample for measurement including a cross section parallel to the normal direction to the surface of the base material is prepared. Next, the cross section is observed with a scanning transmission electron microscope (STEM), and the magnification is adjusted so that the whole thickness-direction region of the coating is included in an observed image. Respective thicknesses at five or more points are measured and the average value of the measured thicknesses is determined as the thickness.

The coating may be a single layer structure made up of a single layer, or a multilayer structure in which two or more layers are stacked together. The coating may be formed on either a part (e.g. cutting edge face) or the whole of the surface of the base material.

The layer may be a compound layer made from: at least one kind of first element selected from the group consisting of Group IV elements (Ti, Zr, Hf), Group V elements (V, Nb, Ta), and Group VI elements (Cr, Mo, W) in the periodic table, Al, and Si; and at least one kind of second element selected from the group consisting of B, C, N, and O. Such a compound layer is suitable as a coating of the cutting tool.

Specific examples of the compound layer may be TiCNO layer, TiBN layer, TiC layer, TiN layer, TiAlN layer, TiSiN layer, AlCrN layer, AlCrON layer, AlCrO layer, TiAlSiN layer, TiAlON layer, AlCrSiCN layer, TiCN layer, TiSiC layer, CrSiN layer, AlTiSiCO layer, TiSiCN layer, $ZrO_2$ layer, $Al_2O_3$ layer, and the like. Layers containing Ti (TiCN layer, TiN layer, for example) are preferable for their particularly excellent hardness. Layers containing Al ($Al_2O_3$ layer for example) are preferable for their particularly excellent oxidation resistance.

Among others, a coating having a multilayer structure made up of a TiN layer, a TiCN layer, and an $Al_2O_3$ layer stacked in this order from the base material side is preferable. Such a multilayer structure can significantly improve the wear resistance, the oxidation resistance, the heat-resistant stability, and the chipping resistance of the cutting tool by a synergistic effect of the layers.

<Method for Manufacturing Cutting Tool>

A method for manufacturing a cutting tool of the present embodiment includes the step of preparing a base material precursor and the step of producing a base material by machining a surface of the base material precursor. In the following, each step is described in detail.

<<Step of Preparing Base Material Precursor>>

In this step, a base material precursor is prepared. The base material precursor may be a cemented carbide or a cermet as described above. The base material precursor is machined into "base material." Specifically, the surface of the base material precursor is machined as detailed later herein to thereby form a cutting edge face. The shape of the base material precursor is therefore similar to the shape of the base material except that the base material precursor does not yet have a cutting edge face.

<<Step of Producing Base Material>>

In this step, a surface of the base material precursor is machined. The machining is one of a first grinding process of alternately repeating wet grinding and dry grinding, a second grinding process of performing low-feed low-depth-of-cut wet grinding, or a third grinding process of performing dry grinding. In this way, the base material of the cutting tool is produced. For a cutting tool made up of the base material only, the cutting tool is completed through this step.

The surface of the base material precursor to be machined is a ridgeline vicinity portion including a ridgeline at which a first surface and a second surface of the base material precursor meet, and a vicinity of the ridgeline. The first surface and the second surface of the base material precursor are respective portions that are to form a rake face and a flank face of the base material, and the ridgeline vicinity portion of the base material precursor is a portion that is to form a cutting edge face of the base material.

For example, the ridgeline vicinity portion machined in an arcuate shape forms a cutting edge face as shown in FIG. 3, and the ridgeline vicinity portion machined in a flat shape forms a cutting edge face as shown in FIG. 4. Specifically, the machining is beveling of the ridgeline vicinity portion of the base material precursor.

First Grinding Process

Examples of the wet grinding (a process using water for grinding) in the first grinding process may include wet brushing, wet barrel finishing, and wet blasting. Conditions for this wet grinding are not particularly limited. For example, the wet grinding may be either high-feed high-depth-of-cut grinding or low-feed low-depth-of-cut grinding.

Examples of the dry grinding (a process using no water for grinding) in the first grinding process may include dry brushing, dry barrel finishing, and dry blasting. Conditions for this dry grinding are not particularly limited. For example, the dry grinding may be either high-feed high-depth-of-cut grinding or low-feed low-depth-of-cut grinding.

The reasons why the first grinding process enables manufacture of the aforementioned cutting tool with a low oxygen concentration are as follows. For the conventional machining of the base material precursor into the base material, the high-feed high-depth-of-cut wet grinding is performed. A first reason for this is a high productivity of the high-feed high-depth-of-cut wet grinding. A second reason for this is that the dry grinding has been considered as causing oxidation of the base material surface due to heat generated during the grinding. A third reason for this is that the productivity of the low-feed low-depth-of-cut wet grinding has been considered as low.

However, this high-feed high-depth-of-cut wet grinding causes oxygen to enter from the cutting edge face toward the inside of the base material, resulting in decrease of the hardness of the base material itself and/or decrease of the adhesiveness between the base material and a coating.

In contrast, according to the method for manufacturing in the present embodiment, the machining in which wet grinding and dry grinding are repeated is performed, instead of the conventional machining in which high-feed high-depth-of-cut wet grinding is performed. Such machining of the present embodiment provides the treated surface (cutting edge face) with the following.

A single wet grinding process is performed to bevel the base material precursor while oxygen enters from the surface of the base material precursor. The time taken to perform this wet grinding can be shortened as compared with the conventional process. Therefore, the width of a high oxygen region after the single wet grinding process is smaller than the conventional process. Further, the dry grinding subsequent to the wet grinding does not cause oxygen to enter into the base material precursor. Therefore, the dry grinding is performed to bevel the base material precursor while removing the high oxygen region formed during the preceding wet grinding.

Thus, consequently the width of the high oxygen region is smaller than the conventional process, or there is no high oxygen region which may influence the physical properties of the base material. Accordingly, the aforementioned base material having an oxygen concentration of less than or equal to 1 at. % at a depth position of 0.4 µm from the cutting edge face is produced.

Although the number of times the wet grinding and the dry grinding are repeated is not particularly limited, each of the wet grinding and the dry grinding is performed at least once. Preferably, the wet grinding and the dry grinding are alternately repeated three or more times. In this way, the width of the high oxygen region formed in each wet grinding process can further be reduced. Accordingly, the final high oxygen region width can also further be reduced. The oxygen concentration itself in the high oxygen region can also be reduced.

Preferably, the initial process in the machining process is the wet grinding and the final process therein is the dry grinding. The wet grinding as the initial process can improve the productivity and the dry grinding as the final process can control the high oxygen region width so that the high oxygen region width is sufficiently small in the finally obtained base material.

Second Grinding Process

Examples of the low-feed low-depth-of-cut wet grinding in the second grinding process may include wet brushing, wet barrel finishing, and wet blasting, like the first grinding process. The second grinding process suppresses entering of oxygen into the base material which is caused by the conventional high-feed high-depth-of-cut wet grinding, and therefore enables manufacture of the aforementioned cutting tool having a low oxygen concentration.

While "low-feed low-depth-of-cut" for wet grinding varies depending on the type of grinding, "low-feed low-depth-of-cut" for wet brushing for example herein means that the feed is 200 mm/sec or less and the depth of cut is 1.5 mm or less. "High-feed high-depth-of-cut" for wet grinding which is wet brushing for example herein means that the feed is 300 mm/sec or more and the depth of cut is 3 mm or more.

The wet grinding in the second grinding process is preferably performed at certain intervals, rather than continuously. Specifically, preferably a process in which the wet grinding is performed for a given time, subsequently stopped for a given time, and subsequently performed for a given time and so on is repeated. In this way, the advantageous effect of suppressing entering of oxygen can be improved.

Third Grinding Process

Examples of the dry grinding in the third grinding process may include dry brushing, dry barrel finishing, and dry blasting, like the first grinding process. Conditions for this dry grinding in the third grinding process are not particularly limited. For example, the dry grinding may be either high-feed high-depth-of-cut grinding or low-feed low-depth-of-cut grinding. The third grinding process suppresses entering of oxygen into the base material which is caused by the conventional high-feed high-depth-of-cut wet grinding, and therefore enables manufacture of the aforementioned cutting tool having a low oxygen concentration.

The first grinding process, the second grinding process, and the third grinding process are as described above. The machining is preferably the first grinding process. In this case, the cutting tool having a low oxygen concentration can be manufactured while keeping a high productivity.

<<Step of Forming Coating>>

The method for manufacturing a cutting tool in the present embodiment may further include the step of forming a coating on a surface of the base material. Accordingly, a cutting tool with a coating formed on the surface of the base material can be manufactured.

As a method for forming the coating, a physical vapor deposition (PVD) or chemical vapor deposition (CVD) method may be used. In the present embodiment, the CVD method is preferably used. When the CVD method is used, the film deposition temperature is 800 to 1200° C. This temperature is higher than that of the physical vapor deposition method. The CVD method thus increases the adhesiveness between the base material and the coating. A conventionally known method may be used as the CVD method.

In this way, the aforementioned cutting tool including the base material having an oxygen concentration of less than or equal to 1 at. % at a depth position of 0.4 µm from the cutting edge face can be manufactured. This cutting tool has a long life.

The strain in the cutting edge face of the base material can be controlled to be small by adjusting conditions for the machining.

<<Other Steps>>

After the coating is formed, surface treatment of the coating may be performed as required, by any of various methods like brushing, or blasting such as sand blasting, wet blasting, shot peening, or bombardment for PVD, for example. Accordingly, a compressive stress can be imparted to the coating.

EXAMPLES

In the following, the present invention is described in further detail with reference to Examples. The present invention, however, is not limited to them.

<Study 1: Non-Coated Cutting Tool>

Non-coated cutting tools of Sample Nos. 1A, 1B, 1C, 1D, 1a, and 1b were produced, and characteristics of them were evaluated. Sample Nos. 1A to 1D are Examples and Sample Nos. 1a and 1b are Comparative Examples.

<<Production of Cutting Tool of Sample No. 1A>>

The cutting tool of Sample No. 1A (indexable insert) was produced in the following way. The cutting tool is formed of a base material with the following specifications.

Insert Model No.: CNMG120408N-UX (manufactured by Sumitomo Electric Hardmetal)

Material: cemented carbide specified by JIS B4120 (2013)

First, raw material powder made up of a mixture having a composition: 2.0 mass % TaC, 1.0 mass % NbC, 6 mass % Co, and the balance WC (containing inevitable impurities) was press-formed in a predetermined shape, and thereafter sintered at 1300 to 1500° C. for 1 to 2 hours. Accordingly, a base material precursor was obtained.

Next, on a ridgeline vicinity portion of the base material precursor, the below-described wet grinding and dry grinding were alternately repeated in this order five times, i.e., the first grinding process was performed. Accordingly, the ridgeline vicinity portion of the base material precursor was machined so that an arcuate cutting edge face with R=0.03 mm was formed. In this way, the base material for Sample No. 1A, i.e., the cutting tool of Sample No. 1A was produced.

Wet Grinding
type: barrel finishing
media: plastic
process liquid: water
time: 5 minutes
Dry Grinding
type: brushing
brush: nylon
rotational speed: 100 rpm
depth of cut: 1.5 mm
feed: 150 mm/sec
process liquid: none
time: 1 minute
paste: diamond paste with an average particle size of 10 μm or less
(liquid component contained in the paste is solid oil)
<<Production of Cutting Tool of Sample No. 1B>>

The cutting tool of Sample No. 1B was produced similarly to Sample No. 1A except that the below-described low-feed low-depth-of-cut wet grinding, i.e., second grinding process, was performed as the machining of the base material precursor.

Wet Grinding
type: barrel finishing
media: plastic
process liquid: water
time: 3 minutes
<<Production of Cutting Tool of Sample No. 1C>>

The cutting tool of Sample No. 1C was produced similarly to Sample No. 1A except that the below-described dry grinding, i.e., third grinding process, was performed as the machining of the base material precursor.

Dry Grinding
type: brushing
brush: nylon
rotational speed: 100 rpm
depth of cut: 1.5 mm
feed: 150 mm/sec
process liquid: none
time: 1 minute
paste: diamond paste with an average particle size of 10 μm or less
(liquid component contained in the paste is solid oil)
<<Production of Cutting Tool of Sample No. 1D>>

The cutting tool of Sample No. 1D (indexable insert) was produced in the following way. This cutting tool is formed of a base material with the following specifications.

Insert Model No.: CNMG120408N-UX (manufactured by Sumitomo Electric Hardmetal)

Material: cermet of grade P20

First, raw material powder made up of a mixture having a composition: 7 mass % NbC, 7 mass % $Mo_2C$, 10 mass % Co, 5 mass % Ni, 20 mass % WC, and the balance TiCN (containing inevitable impurities) was press-formed in a predetermined shape, and thereafter sintered at 1300 to 1650° C. for 1 to 2 hours. Accordingly, a base material precursor was obtained.

Next, on a ridgeline vicinity portion of the base material precursor, machining was performed similarly to Sample No. 1A except that the process time and the number of repetition times of each of the above-described wet grinding and dry grinding were changed. Accordingly, the ridgeline vicinity portion of the base material precursor was machined so that an arcuate cutting edge face with R=0.03 mm was formed. In this way, the cutting tool of Sample No. 1D was produced.

<<Production of Cutting Tool of Sample No. 1a>>

The cutting tool of Sample No. 1a was produced similarly to Sample No. 1A except that the below-described high-feed high-depth-of-cut wet grinding was performed without performing the above-described dry grinding, as the machining of the base material precursor.

Wet Grinding
type: barrel finishing
media: plastic
process liquid: water
time: 3 minutes
<<Production of Cutting Tool of Sample No. 1b>>

The cutting tool of Sample No. 1b was produced similarly to Sample No. 1D except that the wet grinding similar to Sample No. 1a was performed without performing the above-described dry grinding, as the machining of the base material precursor.

<<Evaluation of Characteristics>>

For each cutting tool, the oxygen concentration at a depth position of 0.4 μm from the cutting edge face, the oxygen concentration at a depth position of 0.2 μm from the cutting edge face, and strain in the cutting edge face were each measured in the way as described above.

The oxygen concentrations and the strain were each measured at given three measurement sites of the cutting edge face (surface having undergone honing with R=0.3 mm). One of the three measurement sites was a central portion of the cutting edge face. The results are shown in Table 1.

The following apparatuses were used.

XPS analyzer (for measurement of oxygen concentration): "JPS-9030" manufactured by JEOL Ltd.

x-ray apparatus (for measurement of strain): "SPring 8," Japan Synchrotron Radiation Research Institute: JASRI Conditions for the radiation (high brightness x-ray) of SPring-8 used for measurement of strain by x-ray diffractometry are as follows.

beam line: BL16XU
incident x-ray energy: 10.012 keV (wavelength λ: 1.2385 angstrom)
scanning range: 20° to 120° at 2θ

TABLE 1

| sample | base material | 0.4 oxygen concentration (at. %) | 0.2 oxygen concentration (at. %) | strain | Test 1 Vb (mm) | Test 2 Vb (mm) |
|---|---|---|---|---|---|---|
| No. 1A | cemented carbide | 0.8 | 6.3 | 0.03 | 1.75 | 2.05 |
| No. 1B | cemented carbide | 0.8 | 7.5 | 0.04 | 1.82 | 2.12 |
| No. 1C | cemented carbide | 0.7 | 8.2 | 0.03 | 1.92 | 1.95 |
| No. 1D | cermet | 0.7 | 8.5 | 0.03 | 1.65 | 1.82 |
| No. 1a | cemented carbide | 1.2 | 10.5 | 0.15 | 4.82 | 4.96 |
| No. 1b | cermet | 1.5 | 11.2 | 0.10 | fracture | fracture |

In Table 1, the column "0.4 oxygen concentration (at. %)" indicates the oxygen concentration at a depth position of 0.4 μm from the cutting edge face, and the column "0.2 oxygen concentration (at. %)" indicates the oxygen concentration at a depth position of 0.2 μm from the cutting edge face. The values of oxygen concentrations and strain are each an average value of measurements taken at three measurement sites.

<<Test 1: Fracture Resistance Test>>

With each cutting tool, cutting was performed under the following cutting conditions. The average wear amount Vb (mm) of the flank face after a cutting time of 20 minutes was measured. The results are shown in Table 1. For this test, a low-alloy steel undergoes low-speed cutting, and therefore, the workpiece to be cut is likely to adhere to the cutting tool. When the component adhering to the cutting tool drops off, hard particles are likely to drop off, and consequently the wear amount increases. In view of this, this test can be performed to evaluate the fracture resistance of the cutting tool. Specifically, the smaller the value of Vb (mm), the higher the fracture resistance. In the Table, "fracture" means that the cutting edge was significantly fractured and the wear amount was therefore unmeasurable.

Cutting Conditions
workpiece: SCM415
cutting speed: 100 m/min
feed: 0.2 mm/rev
depth of cut: 2.0 mm
cutting liquid: water-soluble cutting oil <<Test 2: Wear Resistance Test>>

With each cutting tool, cutting was performed under the following cutting conditions. The average wear amount Vb (mm) of the flank face after a cutting time of 15 minutes was measured. The results are shown in Table 1. The smaller the value of Vb (mm), the higher the wear resistance. In the Table, "fracture" means that the cutting edge was significantly fractured and the wear amount was therefore unmeasurable.

Cutting Conditions
workpiece: FCD700
cutting speed: 200 m/min
feed: 0.2 mm/rev
depth of cut: 2.0 mm
cutting liquid: water-soluble cutting oil As shown in Table 1, the cutting tools of Sample Nos. 1A to 1D exhibited higher fracture resistance and higher wear resistance as compared with the cutting tools of Sample Nos. 1a and 1b. It was thus confirmed that the cutting tools of the Examples were longer in life than the cutting tools of the Comparative Examples.

<Study 2: Coated Cutting Tool>

Coated cutting tools of Sample Nos. 2A, 2B, 2C, 2D, 2E, 2F, 2G, 2H, 2I, 2J, 2K, 2L, 2a, 2b, 2c, 2d, and 2e were produced, and characteristics of them were evaluated. Sample Nos. 2A to 2L are Examples and Sample Nos. 2a to 2e are Comparative Examples.

<<Production of Cutting Tools of Sample Nos. 2A-2L and 2a-2e>>

Respective base materials for Sample Nos. 2A to 2K were each produced in the following way. First, a base material precursor made of a cemented carbide was produced similarly to Sample No. 1A. Next, machining was performed on the base material precursor similarly to Sample No. 1A except that the process time and the number of repetition times of each of the above-described wet grinding and dry grinding were changed appropriately for the machining of the base material precursor. In this way, respective base materials for Sample Nos. 2A to 2K were produced.

The base material for Sample No. 2L was produced in the following way. First, a base material precursor made of a cermet was produced similarly to Sample No. 1D. Next, machining was performed on the base material precursor similarly to Sample No. 1D except that the process time and the number of repetition times of each of the above-described wet grinding and dry grinding were changed appropriately. In this way, the base material for Sample No. 2L was produced.

Respective base materials for Sample Nos. 2a to 2e were each produced in the following way. First, a base material precursor made of a cemented carbide was produced similarly to Sample No. 1A. Next, machining was performed on the base material precursor similarly to Sample No. 1A except that the below-described high-feed high-depth-of-cut wet grinding was performed without performing the above-described dry grinding. In this way, respective base materials for Sample Nos. 2a to 2e were produced.

Wet Grinding
type: barrel finishing
media: plastic
process liquid: water
time: 3 minutes Next, a CVD apparatus was used to form a coating shown in Table 2 on the entire surface of each base material by the MT-CVD method. For example, "base material/TiN(0.4)/TiCN(6.5)/Al$_2$O$_3$(3.5)/TiN(0.7)" of No. 2A indicates that a coating was formed in which a TiN layer, a TiCN layer, an Al$_2$O$_3$ layer, and a TiN layer were stacked in this order from the surface of the base material. In the parentheses following the composition of each layer, the thickness (μm) of the layer is indicated. The MT-CVD method is a method for depositing a layer under a relatively mild temperature environment of 850 to 950° C.

TABLE 2

| sample | coating |
| --- | --- |
| No. 2A | base material/TiN (0.4)/TiCN (6.5)/Al$_2$O$_3$ (3.5)/TiN (0.5) |
| No. 2B | base material/TiN (0.4)/TiCN (8.3)/Al$_2$O$_3$ (5.5)/TiN (0.5) |
| No. 2C | base material/TiN (0.4)/TiCN (4.5)/TiAlN (3.0) |
| No. 2D | base material/TiN (0.4)/TiAlN (5.5) |
| No. 2E | base material/TiN (0.4)/TiAlSiN (3.5)/AlCrN (3.5) |
| No. 2F | base material/TiN (0.4)/TiCN (6.5)/Al$_2$O$_3$ (3.5)/TiN (0.5) |
| No. 2G | base material/TiN (0.4)/TiCN (4.0)/Al$_2$O$_3$ (2.5)/TiN (0.5) |
| No. 2H | base material/TiN (0.4)/TiCN (5.0)/Al$_2$O$_3$ (4.5)/TiN (0.5) |
| No. 2I | base material/TiN (0.4)/TiCN (6.5)/Al$_2$O$_3$ (3.5)/TiN (0.5) |
| No. 2J | base material/TiN (0.4)/TiCN (8.3)/Al$_2$O$_3$ (5.5)/TiN (0.5) |
| No. 2K | base material/TiN (0.4)/TiCN (4.5)/TiAlN (3.0) |
| No. 2L | base material/TiN (0.4)/TiCN (5.0) |
| No. 2a | base material/TiN (0.4)/TiCN (6.5)/Al$_2$O$_3$ (3.5)/TiN (0.5) |
| No. 2b | base material/TiN (0.4)/TiCN (6.5)/Al$_2$O$_3$ (3.5)/TiN (0.5) |
| No. 2c | base material/TiN (0.4)/TiCN (8.3)/Al$_2$O$_3$ (5.5)/TiN (0.5) |
| No. 2d | base material/TiN (0.4)/TiCN (4.5)/TiAlN (3.0) |
| No. 2e | base material/TiN (0.4)/TiCN (5.0) |

Next, blasting was performed on the entire surface of the coating formed on the surface of each base material. For example, for the base material for No. 2A, balls made of aluminum oxide having an average particle size of 50 μm were forced to impinge uniformly against the rake face, the flank face, and the cutting edge face for 5 seconds by means of compressed air (projection pressure) at 0.10 MPa, in the direction at 45° with respect to an imaginary ridgeline formed by an imaginary plane including the rake face and an imaginary plane including the flank face, while the base material was rotated at 100 rpm. For the base materials for Nos. 2B to 2L and 2a to 2e, the projection pressure and the process time were changed appropriately to obtain respective cutting tools of Sample Nos. 2A to 2L and 2a to 2e.

<<Evaluation of Characteristics>>

For each cutting tool, the oxygen concentration at a depth position of 0.4 μm from the cutting edge face, the oxygen concentration at a depth position of 0.2 μm from the cutting edge face, and the strain in the cutting edge face were each measured in the way as described above.

The oxygen concentrations and the strain were each measured at given three measurement sites of the cutting edge face. One of the three measurement sites was a central portion of the cutting edge face. The results are shown in Table 3. The apparatuses used for measuring the values were similar to those described above.

TABLE 3

| sample | base material | 0.4 oxygen concentration (at. %) | 0.2 oxygen concentration (at. %) | strain | Test 3 Vb (mm) | Test 4 Vb (mm) |
|---|---|---|---|---|---|---|
| No. 2A | cemented carbide | 0.8 | 8.5 | 0.02 | 0.07 | 0.12 |
| No. 2B | cemented carbide | 0.8 | 6.3 | 0.03 | 0.04 | 0.09 |
| No. 2C | cemented carbide | 0.9 | 9.2 | 0.02 | 0.05 | 0.11 |
| No. 2D | cemented carbide | 0.7 | 5.3 | 0.06 | 0.06 | 0.08 |
| No. 2E | cemented carbide | 0.8 | 8.8 | 0.04 | 0.05 | 0.12 |
| No. 2F | cemented carbide | 0.9 | 5.4 | 0.09 | 0.12 | 0.18 |
| No. 2G | cemented carbide | 0.7 | 9.2 | 0.12 | 0.11 | 0.17 |
| No. 2H | cemented carbide | 0.8 | 8.3 | 0.15 | 0.09 | 0.18 |
| No. 2I | cemented carbide | 0.7 | 13.5 | 0.09 | 0.15 | 0.21 |
| No. 2J | cemented carbide | 0.8 | 15.2 | 0.11 | 0.14 | 0.22 |
| No. 2K | cemented carbide | 0.7 | 11.3 | 0.14 | 0.16 | 0.21 |
| No. 2L | cermet | 0.7 | 4.2 | 0.03 | 0.04 | 0.09 |
| No. 2a | cemented carbide | 1.2 | 13.2 | 0.08 | 3.25 | 3.89 |
| No. 2b | cemented carbide | 1.3 | 14.2 | 0.32 | 2.85 | 3.46 |
| No. 2c | cemented carbide | 2.4 | 15.6 | 0.21 | 2.36 | 3.65 |
| No. 2d | cemented carbide | 1.2 | 12.1 | 0.12 | 3.49 | 3.35 |
| No. 2e | cemented carbide | 1.4 | 14.3 | 0.32 | 2.43 | 3.74 |

In Table 3, the column "0.4 oxygen concentration (at. %)" indicates the oxygen concentration at a depth position of 0.4 μm from the cutting edge face, and the column "0.2 oxygen concentration (at. %)" indicates the oxygen concentration at a depth position of 0.2 μm from the cutting edge face. The values of oxygen concentrations and strain are each an average of measurements taken at three measurement sites.

<<Test 3: Fracture Resistance Test>>

With each cutting tool, cutting was performed under the following cutting conditions. The average wear amount Vb (mm) of the flank face after a cutting time of 20 minutes was measured. The results are shown in Table 3. For this test, a low-alloy steel undergoes low-speed cutting, and therefore, the workpiece to be cut is likely to adhere to the cutting tool. When the component adhering to the cutting tool drops off, hard particles are likely to drop off, and consequently the wear amount increases. In view of this, this test can be performed to evaluate the fracture resistance of the cutting tool. Specifically, the smaller the value of Vb (mm), the higher the fracture resistance.

Cutting Conditions
workpiece: SCM415
cutting speed: 100 m/min
feed: 0.2 mm/rev
depth of cut: 2.0 mm
cutting liquid: water-soluble cutting oil <<Test 4: Wear Resistance Test>>

With each cutting tool, cutting was performed under the following cutting conditions. The average wear amount Vb (mm) of the flank face after a cutting time of 15 minutes was measured. The results are shown in Table 3. The smaller the value of Vb (mm), the higher the wear resistance.

Cutting Conditions
workpiece: FCD700
cutting speed: 200 m/min
feed: 0.2 mm/rev
depth of cut: 2.0 mm
cutting liquid: water-soluble cutting oil As shown in Table 3, the cutting tools of Sample Nos. 2A to 2L exhibited higher fracture resistance and higher wear resistance as compared with the cutting tools of Sample Nos. 2a to 2e. It was thus confirmed that the cutting tools of the Examples were longer in life than the cutting tools of the Comparative Examples.

The embodiments and Examples of the present invention are those as described above. It is originally intended that features of the above-described embodiments and Examples may be combined as appropriate.

It should be construed that the embodiments and examples disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST

10 cutting tool; 1 base material; 1*a* rake face; 1*b* flank face; 1*c* cutting edge face

The invention claimed is:

1. A cutting tool comprising a base material,
    the base material being a cemented carbide or a cermet,
    a surface of the base material including a rake face, a flank face, and a cutting edge face connecting the rake face to the flank face,
    the base material having an oxygen concentration of less than or equal to 1 at. % at a depth position of 0.4 μm from the cutting edge face.
2. The cutting tool according to claim 1, wherein the base material has an oxygen concentration of less than or equal to 10 at. % at a depth position of 0.2 μm from the cutting edge face.
3. The cutting tool according to claim 1, wherein the cutting edge face of the base material has a strain of less than or equal to 0.07.
4. The cutting tool according to claim 1, further comprising a coating formed on the base material.
5. The cutting tool according to claim 4, wherein the coating includes a compound layer made from:
    at least one kind of first element selected from the group consisting of Group IV elements, Group V elements, and Group VI elements in the periodic table, Al, and Si; and
    at least one kind of second element selected from the group consisting of B, C, N, and O.

6. A method for manufacturing a cutting tool according to claim 1, the method comprising:
- preparing a base material precursor; and
- producing a base material by machining a surface of the base material precursor,
- the machining being one of
    - a first grinding process of alternately repeating wet grinding and dry grinding;
    - a second grinding process of performing low-feed low-depth-of-cut wet grinding, or
    - a third grinding process of performing dry grinding.

7. The method for manufacturing a cutting tool according to claim 6, further comprising forming a coating on a surface of the base material.

\* \* \* \* \*